United States Patent
Eom et al.

(10) Patent No.: US 11,488,841 B2
(45) Date of Patent: Nov. 1, 2022

(54) METHOD FOR MANUFACTURING SEMICONDUCTOR PACKAGE

(71) Applicant: ELECTRONICS AND TELECOMMUNICATIONS RESEARCH INSTITUTE, Daejeon (KR)

(72) Inventors: Yong Sung Eom, Daejeon (KR); Kwang-Seong Choi, Daejeon (KR); Ki Seok Jang, Sejong-si (KR); Seok-Hwan Moon, Daejeon (KR); Jiho Joo, Sejong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 252 days.

(21) Appl. No.: 16/795,009

(22) Filed: Feb. 19, 2020

(65) Prior Publication Data

US 2020/0266078 A1 Aug. 20, 2020

(30) Foreign Application Priority Data

Feb. 20, 2019 (KR) .................. 10-2019-0020126
May 17, 2019 (KR) .................. 10-2019-0058003
Feb. 3, 2020 (KR) .................. 10-2020-0012746

(51) Int. Cl.
*H01L 21/50* (2006.01)
*H01L 23/00* (2006.01)
(Continued)

(52) U.S. Cl.
CPC .......... *H01L 21/50* (2013.01); *H01L 21/4853* (2013.01); *H01L 24/81* (2013.01);
(Continued)

(58) Field of Classification Search
CPC ......... H01L 24/13; H01L 24/81; H01L 24/29; H01L 21/4853; H01L 24/83; H01L 21/50;
(Continued)

(56) References Cited

U.S. PATENT DOCUMENTS 9,853,010 B2 12/2017 Choi et al.
2010/0213600 A1 8/2010 Lau et al.
(Continued)

FOREIGN PATENT DOCUMENTS

EP 2357159 A1 8/2011
JP 5413373 B2 2/2014
(Continued)

OTHER PUBLICATIONS

R. Daily, et al., "3D IC Process Development for Enabling Chip-on-Chip and Chip on Wafer Multi-Stacking at Assembly", ICEP-IAAC 2015 Proceedings, pp. 56-60, 2015.

*Primary Examiner* — Mouloucoulaye Inoussa
(74) *Attorney, Agent, or Firm* — Rabin & Berdo, P.C.

(57) ABSTRACT

Provided is a method for manufacturing a semiconductor package, the method including providing a semiconductor chip on a substrate, providing a bonding member between the substrate and the semiconductor chip, and bonding the semiconductor chip on the substrate by irradiating of a laser on the substrate. Here, the bonding member may include a thermosetting resin, a curing agent, and a laser absorbing agent.

15 Claims, 10 Drawing Sheets

(51) Int. Cl.
*H01L 21/48* (2006.01)
*H01L 21/60* (2006.01)

(52) U.S. Cl.
CPC ........... *H01L 2021/60112* (2013.01); *H01L 2021/60225* (2013.01); *H01L 2224/81224* (2013.01)

(58) Field of Classification Search
CPC ....... H01L 21/563; H01L 24/16; H01L 24/32; H01L 24/09; B23K 26/20; B23K 1/20; B23K 1/0056; B23K 1/0016
USPC ............. 361/803; 428/457, 418; 228/180.21, 228/248.1; 348/294; 359/885
See application file for complete search history.

(56) References Cited

U.S. PATENT DOCUMENTS

| | | | | |
|---|---|---|---|---|
| 2011/0156279 | A1* | 6/2011 | Takamoto | H01L 21/561 428/343 |
| 2011/0223371 | A1 | 9/2011 | Kawanami | |
| 2011/0284265 | A1* | 11/2011 | Sakai | H01L 24/29 228/248.1 |
| 2012/0089180 | A1* | 4/2012 | Fathi | H01L 24/83 257/E23.116 |
| 2013/0258632 | A1* | 10/2013 | Ebe | H05K 13/04 361/803 |
| 2013/0334291 | A1* | 12/2013 | Eom | H01L 24/11 228/256 |
| 2014/0287556 | A1* | 9/2014 | Choi | H05K 3/3478 438/613 |
| 2015/0043175 | A1* | 2/2015 | Choi | H05K 1/0283 174/254 |
| 2015/0228617 | A1* | 8/2015 | Lee | H01L 24/81 257/772 |
| 2015/0253477 | A1* | 9/2015 | Nakao | G02B 5/208 359/885 |
| 2016/0280965 | A1* | 9/2016 | Motomura | H01L 24/83 |
| 2017/0062379 | A1* | 3/2017 | Zhang | H01L 24/16 |
| 2017/0141071 | A1* | 5/2017 | Choi | H01L 21/563 |
| 2017/0236811 | A1 | 8/2017 | Pokhriyal et al. | |
| 2017/0271290 | A1* | 9/2017 | Liao | H01L 24/73 |
| 2018/0076368 | A1* | 3/2018 | Hussell | H01L 25/0753 |
| 2018/0269074 | A1* | 9/2018 | Kamikoriyama | H01L 24/12 |
| 2018/0301432 | A1* | 10/2018 | Shinohara | H05K 3/323 |
| 2019/0067235 | A1* | 2/2019 | Choi | H01L 24/83 |
| 2019/0206587 | A1* | 7/2019 | Sou | C08L 101/12 |
| 2019/0211231 | A1* | 7/2019 | Jang | H01L 21/563 |

FOREIGN PATENT DOCUMENTS

| | | |
|---|---|---|
| KR | 10-2011-0098894 A | 9/2011 |
| KR | 10-2017-0057909 A | 5/2017 |
| KR | 10-2019-0024633 A | 3/2019 |

\* cited by examiner

METHOD FOR MANUFACTURING SEMICONDUCTOR PACKAGE

CROSS-REFERENCE TO RELATED APPLICATIONS

This U.S. non-provisional patent application claims priority under 35 U.S.C. § 119 of Korean Patent Application Nos. 10-2019-0020126, filed on Feb. 20, 2019, 10-2019-0058003, filed on May 17, 2019, and 10-2020-0012746, field on Feb. 3, 2020, the entire contents of which are hereby incorporated by reference.

BACKGROUND

The present disclosure herein relates to a method for manufacturing a semiconductor package, and more particularly, to a method for manufacturing a semiconductor package using a bonding member.

In general, a thermal compression bonding process using a flip chip bonder or a thermal curing process using a reflow process is generally used for a bonding process of a hybrid underfill material based on a polymer resin and solder powder or a no-flow underfill material based on a polymer, which are used as a semiconductor package bonding material. Since the above-described semiconductor bonding process uses hot air or a halogen lamp as a heat source, a process time thereof requires several minutes. A substrate used in the semiconductor packaging requires high heat resistance to undergo a long time heating process, and the substrate having the high heat resistance is expensive to cause high material costs.

The semiconductor packages are generally mounted on a package substrate. The package substrate may include a rigid substrate and a flexible substrate. The rigid substrate may include PET, PEN, polyimide, glass, silicon, or sapphire. In general, the flexible substrate may include a polymer. The flexible substrate may be vulnerable to heat during a packaging process.

SUMMARY

The present disclosure provides a method for manufacturing a semiconductor package, which has a high adhesive efficiency.

The present disclosure also provides a method for manufacturing a semiconductor package, which causes little damage on a substrate and a semiconductor chip.

The object of the present invention is not limited to the aforesaid, but other objects not described herein will be clearly understood by those skilled in the art from descriptions below.

An embodiment of the inventive concept provides a method for manufacturing a semiconductor package, the method including: providing a semiconductor chip on a substrate; providing a bonding member between the substrate and the semiconductor chip; and bonding the semiconductor chip on the substrate by irradiating of a laser on the substrate. Here, the bonding member includes a thermosetting resin, a curing agent, and a laser absorbing agent.

In an embodiment, the bonding of the semiconductor chip may include: a first process of irradiating of the laser on a portion of the bonding member, the portion of the bonding member is exposed to one side of the semiconductor chip; and a second process of irradiating of the laser on the semiconductor chip.

In an embodiment, the bonding member may be heated by absorbing the laser during the first process.

In an embodiment, during the second process, the semiconductor chip may be heated by the laser, and the bonding member may receive heat from the semiconductor chip.

In an embodiment, the bonding member may further include a solder material, and the bonding member may be provided between a substrate pad of the substrate and a chip pad of the semiconductor chip.

In an embodiment, the bonding member may form a first connection terminal configured to connect the substrate pad and the chip pad by the irradiating of the laser.

In an embodiment, the method may further include mounting the semiconductor chip on the substrate before the providing of the bonding member between the substrate and the semiconductor chip. Here, the semiconductor chip may be mounted to the substrate by using a second connection terminal, and the bonding member may fill a remain space between the substrate and the semiconductor chip.

In an embodiment, the second connection terminal may include a solder ball provided between a substrate pad of the substrate and a chip pad of the semiconductor chip or a bonding wire extending from a top surface of the semiconductor chip to the substrate pad of the substrate.

In an embodiment, the laser absorbing agent may include dyes such as acid dyes, natural dyes, basic dyes, cationic dyes, synthetic dyes, direct dyes, substantive dyes, disperse dyes, sulfur dyes, pigment dyes, mordant dyes, vat dyes, reactive dyes, macromolecular dyes, metallized dyes, naphthol dyes, premetallized dyes, gel dyeing, developed dyes, azo dyes, aniline dyes, and anthraquinone dyes.

In an embodiment, the laser absorbing agent may have a weight of about 4% to about 8% of a weight of the thermosetting resin.

In an embodiment, the laser absorbing agent may include a rubber carbon material such as rubber carbon black, N234 carbon black, N326 carbon black, N339 carbon black, and SAF (super abrasion furnace) grade 762 carbon black, or an electrical conductive carbon black.

In an embodiment, the laser absorbing agent may have a weight of about 0.2% to about 0.6% of a weight of the thermosetting resin.

In an embodiment, an irradiation time of the laser may be in a range from about one second to about ten seconds.

In an embodiment, the bonding member may further include a reducing agent.

An embodiment of the inventive concept provides a method for manufacturing a semiconductor package, the method including: providing a bonding member on a chip pad of a semiconductor chip; disposing the semiconductor chip on a substrate so that the bonding member contacts a substrate pad of the substrate; and forming a connection terminal by irradiating of a laser to the bonding member. Here, the bonding member includes a solder material and a laser absorbing agent.

In an embodiment, a first portion of the bonding member may protrude to one side of the semiconductor chip, and the first portion of the bonding member may be directly irradiated by the laser to form the connection terminal.

In an embodiment, a second portion of the bonding member providing between the substrate and the semiconductor chip, may receive heat from the semiconductor chip heated by the laser to form the connection terminal.

In an embodiment, an irradiation time of the laser may be in a range from about one second to about ten seconds.

In an embodiment, the bonding member may include a thermosetting resin and a curing agent, and the bonding member may be cured during the irradiating of the laser.

In an embodiment, the laser absorbing agent may include dyes such as acid dyes, natural dyes, basic dyes, cationic dyes, synthetic dyes, direct dyes, substantive dyes, disperse dyes, sulfur dyes, pigment dyes, mordant dyes, vat dyes, reactive dyes, macromolecular dyes, metallized dyes, naphthol dyes, premetallized dyes, gel dyeing, developed dyes, azo dyes, aniline dyes, and anthraquinone dyes, a rubber carbon material such as rubber carbon black, N234 carbon black, N326 carbon black, N339 carbon black, SAF (super abrasion furnace) grade 762 carbon black, or an electrical conductive carbon black.

In an embodiment, the connection terminal may electrically connect the chip pad and the substrate pad.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
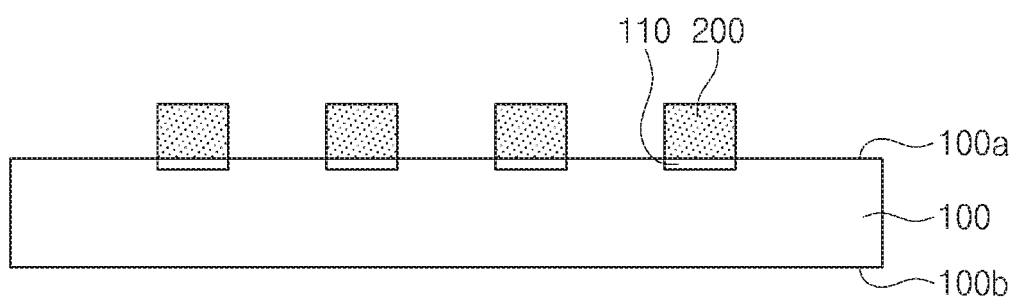
FIGS. 1 to 4 are cross-sectional views for explaining a method for manufacturing a semiconductor package according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Hereinafter, the present invention will be described in detail by explaining preferred embodiments of the invention with reference to the attached drawings.

<Bonding Member Composite>

A bonding member composite according to embodiments of the inventive concept may have a composition in which a thermosetting resin, a curing agent, a reducing agent, a catalytic agent, and a laser absorbing agent are mixed. The bonding member composite may be used for attaching or bonding an electronic component such as a semiconductor chip to a substrate or another electronic component to another electronic component.

The thermosetting resin of the bonding member composite may increase durability of the bonding member composite and substantially provide an adhesive force with respect to a substrate, an element, or a chip when mounting or bonding the substrate, the element, or the chip by using the bonding member composite. The thermosetting resin may include a material that is cured by heat. For example, the thermosetting resin may include epoxy, phenoxy, bismaleimide, unsaturated polyester, urethane, urea, phenol-formaldehyde, vulcanized rubber, melamine resin, polyimide, novolac epoxy resin, or cyan pyromellitic dianhydrideate ester.

The curing agent may cure the thermosetting resin when heat is provided to the bonding member composite. In a composition of the bonding member composite, the curing agent may have a weight ratio of about 0.5 to about 0.9 based on the thermosetting resin. Preferably, the curing agent may have a weight of about 70% of a weight of the thermosetting resin. The curing agent may include aliphatic amine, aromatic amine, cycloaliphatic amine, phenalkamine, imidazole, carboxylic acid, anhydride, pyromellitic dianhydride (PDMA), polyamide-based hardners, phenolic curing agents, or waterborne curing agents.

The reducing agent may prevent an oxide layer from being generated on the bonding member composite or connection terminals for mounting a substrate, an element, or a chip during a curing process of the bonding member composite, or remove the oxide layer. In the composition of the bonding member composite, the reducing agent may have a weight ratio of about 0.1 to about 0.2 based on the thermosetting resin. Preferably, the reducing agent may have a weight of about 14.6% of the weight of the thermosetting resin. The reducing agent may include formic acid, acetic acid, lactic acid, glutamic acid, oleic acid, rosolic acid, 2,2-bis(hydroxymethylene)propanoic acid, butanoic acid, propanoic acid, tannic acid, gluconic acid, pentanoic acid, hexanoic acid, hydrobromic acid, hydrochloric acid, uric acid, hydrofluoric acid, sulfuric acid, glutaric acid, malic acid, phosphoric acid, oxalic acid, uranic acid, hydrochlorate, perchloric acid, gallic acid, phosphorous acid, citric acid, malonic acid, tartaric acid, phthalic acid, cinnamic acid, hexanoic acid, propionic acid, stearic acid, ascorbic acid, acetylsalicylic acid, azelaic acid, benzilic acid, or fumaric acid.

The catalytic agent may be a catalyst for adjusting a reaction rate of the bonding member composite during the curing process of the bonding member composite. In the composition of the bonding member composite, the catalytic agent may have a weight ratio of about 0.002 to about 0.006 based on the thermosetting resin. Preferably, the catalytic agent may have a weight of about 0.4% of the weight of the thermosetting resin. The catalytic agent may include 1-methyl imidazole, 2-methyl imidazole, dimethylbenzyl imidazole, 1-decyl-2-methylimidazole, benzyl dimethyl amine, trimethyl amine, triethyl amine, diethylamino propylamine, pyridine, 2-heptadecyl imidazole, boron trifluoride monoethylamine, 1-(3(2-hydroxyphenyl)prop-2-enyl) imidazole, or 18-diazobicyclo[5,4,0]undec-7-ene.

The laser absorbing agent may absorb a laser and convert the absorbed laser into thermal energy. For example, when a substrate, an element, or a chip is mounted or bonded by using the bonding member composite, the laser absorbing agent may absorb the laser to heat the bonding member composite, and the bonding member composite may be cured. The laser absorbing agent may include dyes such as acid dyes, natural dyes, basic dyes, cationic dyes, synthetic dyes, direct dyes/substantive dyes, disperse dyes, sulfur dyes, pigment dyes, mordant dyes, vat dyes, reactive dyes, macromolecular dyes, metallized dyes/premetallized dyes, naphthol dyes, gel dyeing, developed dyes, azo dyes, aniline dyes, and anthraquinone dyes, a rubber carbon material such as rubber carbon black, N234 Carbon black, N326 Carbon black, N339 Carbon black, and SAF (super abrasion furnace) grade 762 Carbon black, or electrical conductive carbon black.

When the laser absorbing agent includes dyes, in a composition of the bonding member composite, the laser absorbing agent may have a weight ratio of about 0.05 to about 0.1 based on the thermosetting resin. For example, the laser absorbing agent may have a weight of about 2% to about 10% of the weight of the thermosetting resin. When the laser absorbing agent has a weight less than about 2% of the weight of the thermosetting resin, the bonding member composite may have a small laser absorptance. When the laser absorbing agent has a weight greater than about 10% of the weight of the thermosetting resin, a void may be generated in the bonding member composite. Most preferably, the laser absorbing agent may have a weight of about 4% to about 8% of the weight of the thermosetting resin.

When the laser absorbing agent include carbon black, in the composition of the bonding member composite, the laser absorbing agent may have a weight ratio of about 0.001 to about 0.01 based on the thermosetting resin. For example, the laser absorbing agent may have a weight of about 0.2% to about 1.0% of the weight of the thermosetting resin. When the laser absorbing agent has a weight less than about 0.2% of the weight of the thermosetting resin, the bonding member composite may have a small laser absorptance. When the laser absorbing agent has a weight greater than about 1.0% of the weight of the thermosetting resin, as the weight of the laser absorbing agent increases, the laser absorptance may not increase. Most preferably, the laser absorbing agent may have a weight of about 0.2% to about 0.6% of the weight of the thermosetting resin.

According to other embodiments, the composition of the bonding member composite may further include a solder member in addition to the thermosetting resin, the curing agent, the reducing agent, the catalytic agent, and the laser absorbing agent. In this case, the bonding member composite may be used for attaching or bonding an electronic component such as a semiconductor chip to a substrate or another electronic component, and additionally used for mounting the electronic component to be electrically connected to a substrate or another electronic component. The solder member may include tin (Sn) or a tin (Sn) alloy including silver (Ag), copper (Cu), or nickel (Ni). The tin (Sn) alloy may contain the tin (Sn) as many as about 90% to about 98% in a composition thereof.

The bonding member composite according to embodiments of the inventive concept may directly absorb the laser and be cured during the laser process by including the laser absorbing agent. That is, the bonding member composite may be cured in an indirect curing method, in which the bonding member composite is cured by receiving heat from a substrate, an element, or a chip disposed therearound and heated by an irradiation of the laser, and in a direct curing method, in which the bonding member composite is directly heated and cured itself by the irradiation of the laser. Thus, an efficiency of the curing process of the bonding member composite may improve, and the substrate, the element, or the chip may be prevented from being damaged due to a short process time (i.e., an irradiation time of the laser).

<Semiconductor Package Manufacturing Method>

FIGS. 1 to 4 are cross-sectional views for explaining a method for manufacturing a semiconductor package according to embodiments of the inventive concept.

Referring to FIG. 1, a substrate 100 may be provided. The substrate 100 may include a rigid substrate or a flexible substrate. For example, the substrate 100 may include an epoxy-based resin or a polyethylene-based resin. The substrate 100 may have a top surface 100*a* and a bottom surface 100*b* opposite to the top surface 100*a*. The substrate 100 may include substrate pads 110 disposed on the top surface 100*a* thereof. The substrate pads 110 may be made of copper (Cu), nickel (Ni), or gold (Au).

A bonding member 200 may be provided on the substrate 100. The bonding member 200 may be disposed on each of the substrate pads 110 of the substrate 100. Here, the bonding member 200 may be a solid. That is, the bonding member 200 may be provided in plurality, and the plurality of bonding members 200 may be disposed on the substrate pads 110, respectively. For example, the bonding member 200 may be provided in the form of a tape. In contrast, the bonding member 200 may be fluid, and in this case, the bonding member 200 may be applied on the substrate pads 110, respectively. The bonding member 200 may include the above-described bonding member composite. That is, the bonding member 200 may be a composite including a thermosetting resin, a curing agent, a reducing agent, a catalytic agent, a laser absorbing agent, and a solder member. Particularly, as the bonding member 200 has a composition including the laser absorbing agent, a curing efficiency of the bonding member 200 may improve, and the substrate 100 and a semiconductor chip 300 (refer to FIGS. 2 and 3) may not be damaged. This will be described later in detail. Since the composition of the bonding member is the same as the above-described bonding member composite, detailed description thereof will be omitted.

Figure 2:
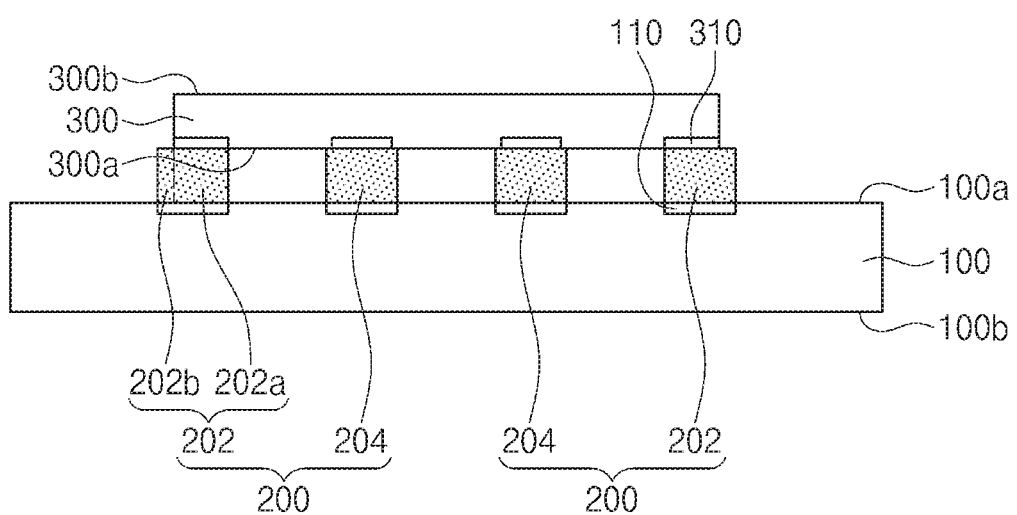

Referring to FIG. 2, the semiconductor chip 300 may be provided on the substrate 100. The semiconductor chip 300 may have a first surface 300a facing the top surface 100a of the substrate 100 and a second surface 300b opposite to the first surface 300a. The semiconductor chip 300 may include chip pads 310 disposed on the first surface 300a. That is, the first surface 300a of the semiconductor chip 300 may be an active surface, and the second surface 300b may be an inactive surface. The chip pads 310 may be made of copper (Cu), nickel (Ni), or gold (Au). The semiconductor chip 300 may include various semiconductor chips such as a logic chip or a memory chip. Here, although a case when the semiconductor chip 300 is provided on the substrate 100 is exemplarily described, the embodiment of the inventive concept is not limited thereto. According to an embodiment of the inventive concept, a different electronic element or a different substrate for being mounted on the substrate 100 may be provided. Hereinafter, the case when the semiconductor chip 300 is provided on the substrate 100 will be continuously described.

The semiconductor chip 300 may be disposed on the substrate 100 so that the chip pads 310 are aligned with the substrate pads 110. The chip pads 310 may contact the bonding members 200. Here, a portion of the bonding members 200 may protrude from a side surface of the semiconductor chip 300. That is, one portion 202a of a bonding member 202 disposed at an outmost portion may overlap the semiconductor chip 300, and the other portion 202b may not overlap the semiconductor chip 300. On a plane, the other portion 202b of the bonding member 202 disposed at the outmost portion may be exposed from the semiconductor chip 300. For convenience of description, the one portion 202a of the outmost bonding member 202, which overlaps the semiconductor chip 300, is referred to as a first portion 202a, and the other portion 202b of the outmost bonding member 202, which is not in overlap with the semiconductor chip 300, is referred to as a second portion 202b.

Figure 3:
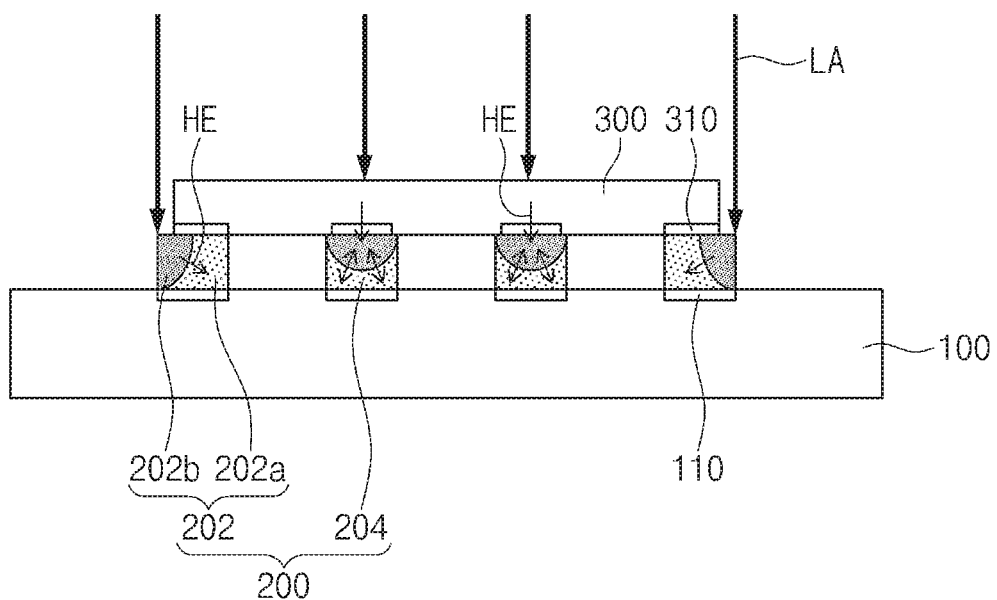

Referring to FIG. 3, the semiconductor chip 300 may be bonded on the substrate 100. For example, a laser irradiation process may be performed on the substrate 100. Particularly, a laser LA may be irradiated on the second surface 300b of the semiconductor chip 300. The semiconductor chip 300 may be heated by the laser LA. Heat HE generated in the semiconductor chip 300 may be transferred toward the bonding members 200. The bonding members 200 may be cured by absorbing the heat HE transferred from the semiconductor chip 300. Here, according to a heat transfer path, the bonding member 200 may be cured in an order from a portion adjacent to the semiconductor chip 300.

In general, when the bonding members are cured by using the laser, the bonding members each having a small contact area with the semiconductor chip (e.g., the outmost bonding member) may hardly receive the heat from the semiconductor chip. Thus, the laser irradiation process may be performed for a long time in order to completely cure all of the bonding members. In this case, the semiconductor chip or the substrate may be damaged by the laser that is irradiated for a long time.

According to an embodiment of the inventive concept, the bonding members 200 may have the composition including the laser absorbing agent. Thus, as the laser LA is directly irradiated to the bonding members (e.g., the outmost boding member 202) protruding from the semiconductor chip 300, the outmost bonding members 202 may be heated by absorbing the laser. The first portion 202a of the outmost bonding member 202 may receive heat from the semiconductor chip 300, and the second portion 202b of the outmost bonding member 202 may be heated by directly absorbing the laser LA. Thus, the second portion 202b of the outmost bonding member 202, which protrudes from the side surface of the semiconductor chip 300 and hardly receives heat from the semiconductor chip 300, may be easily cured.

That is, the bonding member 200 according to an embodiment of the inventive concept may be cured in an indirect curing method, in which the bonding member is cured by receiving heat from the semiconductor chip 300 heated by the irradiation of the laser, and in a direct curing method, in which the bonding member is directly heated and cured itself by the irradiation of the laser. Thus, as the bonding member 200 may be quickly cured, an efficiency of the curing process may improve. Also, according to an embodiment of the inventive concept, the substrate 100 or the semiconductor chip 300 may be prevented from being damaged due to a short process time (i.e., the irradiation time of the laser).

In the process of irradiating of the laser LA, the laser LA may have a wavelength band of about 900 nm to about 1100 nm. The laser irradiation process may be performed during about one second to about ten seconds. However, the embodiment of the inventive concept is not limited thereto. The laser LA used for the laser irradiation process may be selected from lasers in a wavelength band capable of being absorbed by the bonding member 200.

Figure 4:
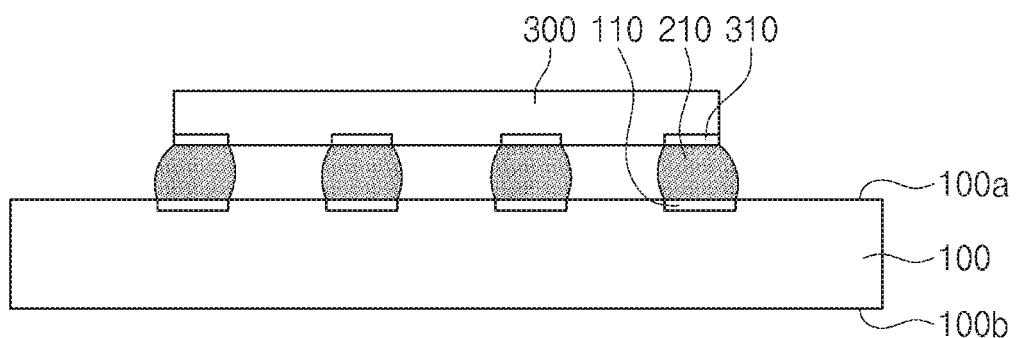

Referring to FIG. 4, the bonding members 200 (refer to FIG. 3) may be cured to form connection terminals 210. For example, after the laser irradiation process described with reference to FIG. 3 is performed, the bonding members 200 may connect the chip pads 310 and the substrate pads 110 in a corresponding manner, respectively. As the bonding members 200 has the composition including the solder member, the connection terminals 210, which is formed as the bonding members 200 are cured, may electrically connect the chip pads 310 and the substrate pads 110. The semiconductor chip 300 may be mounted to the substrate 100 through the connection terminals 210.

The semiconductor package may be formed as described above.

FIGS. 5 to 8 are cross-sectional views for explaining a method for manufacturing a semiconductor package according to embodiments of the inventive concept. For convenience of description, the same features as those described with reference to FIGS. 1 to 4 will be omitted.

Figure 5:
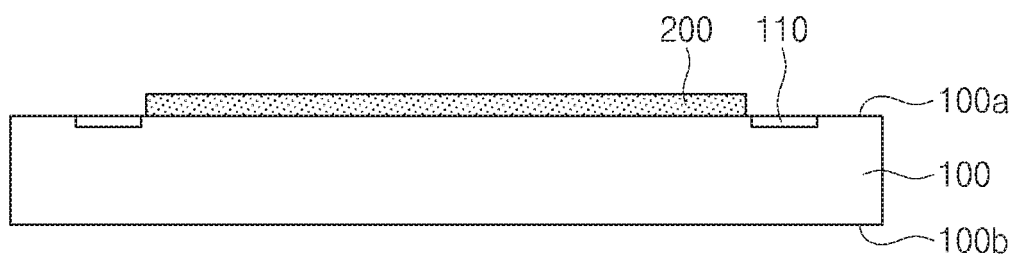
FIGS. 5 to 8 are cross-sectional views for explaining a method for manufacturing a semiconductor package according to embodiments of the inventive concept.

Referring to FIG. 5, a substrate 100 may be provided. The substrate 100 may have a top surface 100a and a bottom surface 100b opposite to the top surface 100a. The substrate 100 may include substrate pads 110 disposed on the top surface 100a thereof. The substrate pads 110 may be provided on an outer portion of the substrate 100. For example, the substrate pads 110 may not be provided on a central portion of the substrate 100, to which a semiconductor chip 300 (refer to FIG. 5) is attached in a following process.

A bonding member 200 may be provided on the substrate 100. The bonding member 200 may be disposed on the central portion of the substrate 100. For example, the bonding member 200 may be provided between the substrate pads 110. Here, the bonding member 200 may be a solid. In contrast, the bonding member 200 may be fluid, and in this case, the bonding member 200 may be applied on the central portion of the substrate 100. The bonding member 200 may include the above-described bonding member composite. That is, the bonding member 200 may be a composite including a thermosetting resin, a curing agent, a reducing agent, a catalytic agent, and a laser absorbing agent. Here, the bonding member 200 may not include a solder member.

Figure 6:
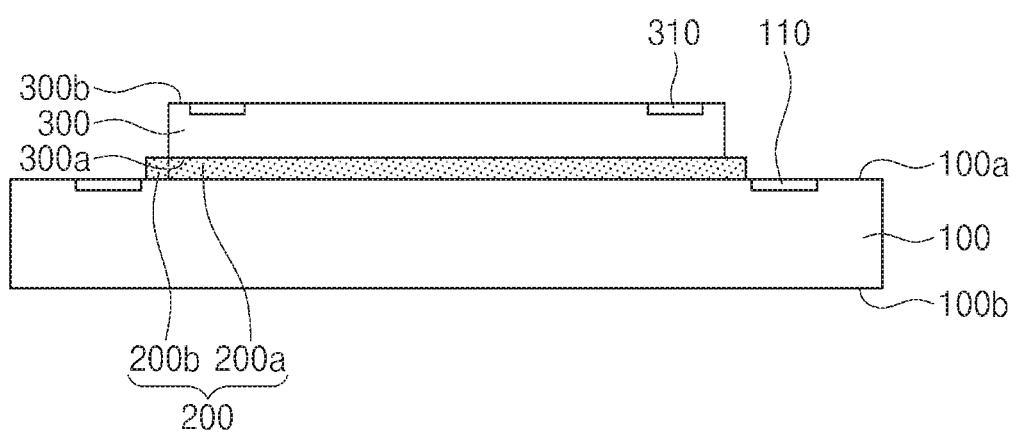

Referring to FIG. 6, the semiconductor chip 300 may be provided on the substrate 100. The semiconductor chip 300 may have a first surface 300a facing the top surface 100a of the substrate 100 and a second surface 300b opposite to the first surface 300a. The semiconductor chip 300 may include chip pads 310 disposed on the second surface 300b. That is, the second surface 300b of the semiconductor chip 300 may be an active surface, and the first surface 300a may be an inactive surface.

The semiconductor chip 300 may be disposed on the substrate 100 so that the first surface of the semiconductor chip 300 contacts the bonding member 200. Here, a portion 200b of the bonding member 200 may protrude from a side surface of the semiconductor chip 300. A first portion 200a of the bonding member 200 may overlap the semiconductor chip, and a second portion 200b of the bonding member 200 may not overlap the semiconductor chip.

Figure 7:
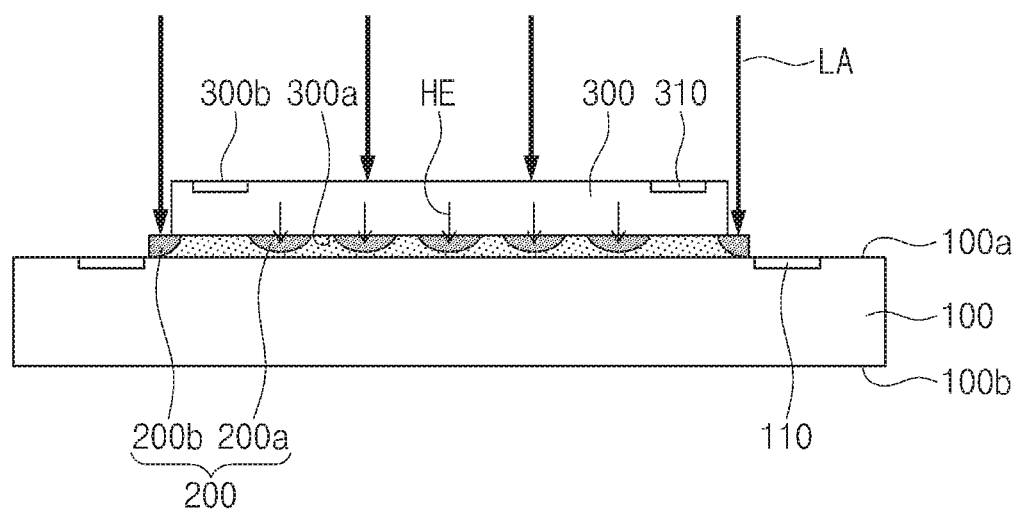

Referring to FIG. 7, the semiconductor chip 300 may be bonded on the substrate 100. For example, a laser irradiation process may be performed on the substrate 100. Particularly, a laser LA may be irradiated on the second surface 300b of the semiconductor chip 300. The semiconductor chip 300 may be heated by the laser LA. Heat HE generated in the semiconductor chip 300 may be transferred to the first portion 200a of the bonding member 200. The first portion 200a of the bonding member 200 may be cured by absorbing the heat HE transferred from the semiconductor chip 300.

The second portion 200b of the bonding member 200 protruding from the semiconductor chip 300 may be heated by directly absorbing the laser LA. The second portion 200b may be cured by absorbing heat from the laser LA.

Figure 8:
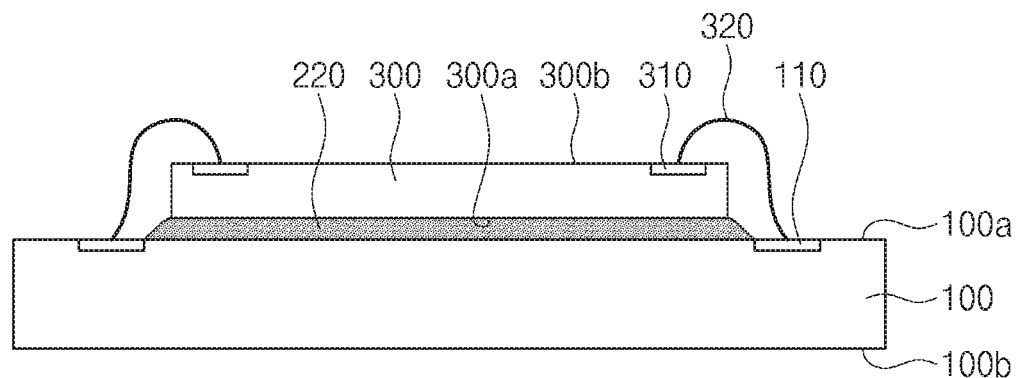
Figure 9:
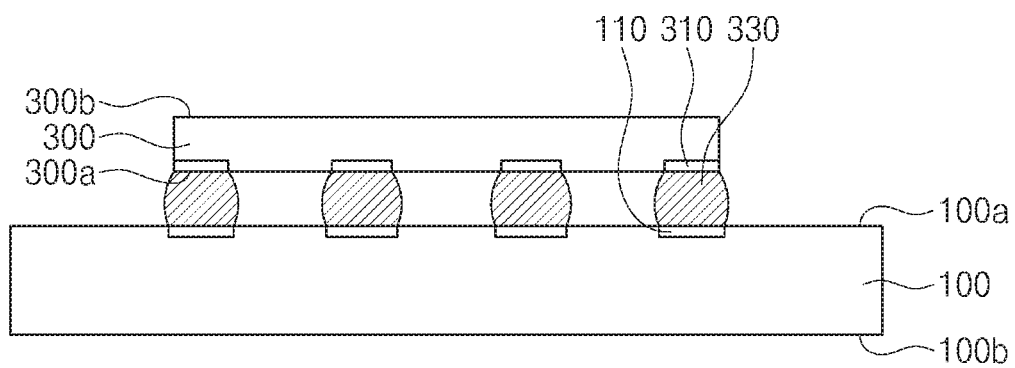
FIGS. 9 to 12 are cross-sectional views for explaining a method for manufacturing a semiconductor package according to embodiments of the inventive concept.

Referring to FIG. 8, the bonding member 200 may be cured to form an adhesive layer 220. The adhesive layer 220 may fix the semiconductor chip 300 on the top surface 100a of the substrate 100.

The semiconductor chip 300 may be mounted to the substrate 100 by electrically connecting the chip pads 310 of the semiconductor chip 300 and the substrate pads 110 of the substrate 100. For example, the semiconductor chip 300 may be mounted to the substrate 100 in a wire bonding method using a bonding wire 320.

The semiconductor package may be formed as described above.

FIGS. 9 to 12 are cross-sectional views for explaining a method for manufacturing a semiconductor package according to embodiments of the inventive concept.

Referring to FIG. 5, a substrate 100 may be provided. The substrate 100 may have a top surface 100a and a bottom surface 100b opposite to the top surface 100a. The substrate 100 may include substrate pads 110 disposed on the top surface 100a thereof.

A semiconductor chip 300 may be provided on the substrate 100. The semiconductor chip 300 may have a first surface 300a facing the top surface 100a of the substrate 100 and a second surface 300b opposite to the first surface 300a. The semiconductor chip 300 may include chip pads 310 disposed on the first surface 300a. That is, the first surface 300a of the semiconductor chip 300 may be an active surface, and the second surface 300b may be an inactive surface.

The semiconductor chip 300 may be mounted to the substrate 100. For example, the semiconductor chip 300 may be mounted to the substrate 100 in a flip chip bonding method. The semiconductor chip 300 and the substrate 100 may be electrically connected by connection terminals 330 formed between the substrate pads 110 and the chip pads 310, respectively.

Figure 10:
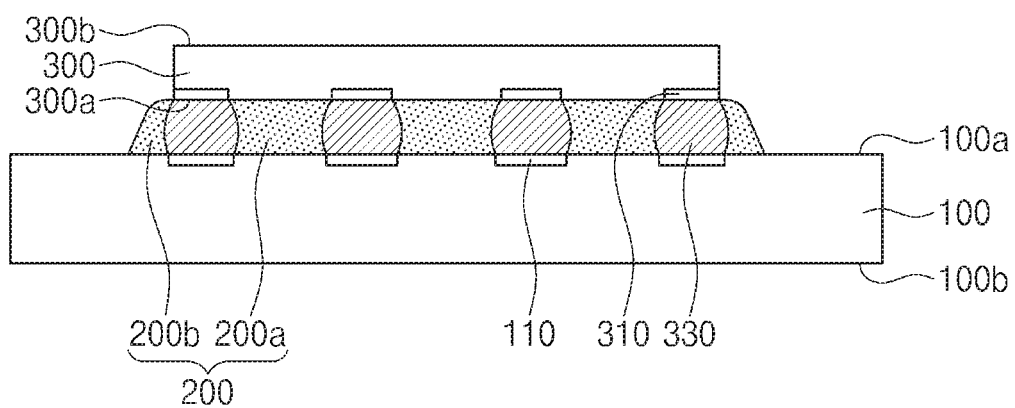

Referring to FIG. 10, a bonding member 200 may be provided between the substrate 100 and the semiconductor chip 300. Here, the bonding member 200 may be a fluid. The bonding member 200 may fill a remain space between the substrate 100 and the semiconductor chip 300 and surround the connection terminals 330. The bonding member 200 may contact the top surface 100a of the substrate 100 and the first surface 300a of the semiconductor chip 300. Here, a portion 200b of the bonding member 200 may protrude from a side surface of the semiconductor chip 300. A first portion 200a of the bonding member 200 may overlap the semiconductor chip 300, and a second portion 200b of the bonding member 200 may not overlap the semiconductor chip 300. The bonding member 200 may include the above-described bonding member composite. That is, the bonding member 200 may be a composite including a thermosetting resin, a curing agent, a reducing agent, a catalytic agent, and a laser absorbing agent. Here, the bonding member 200 may not include a solder member.

Figure 11:
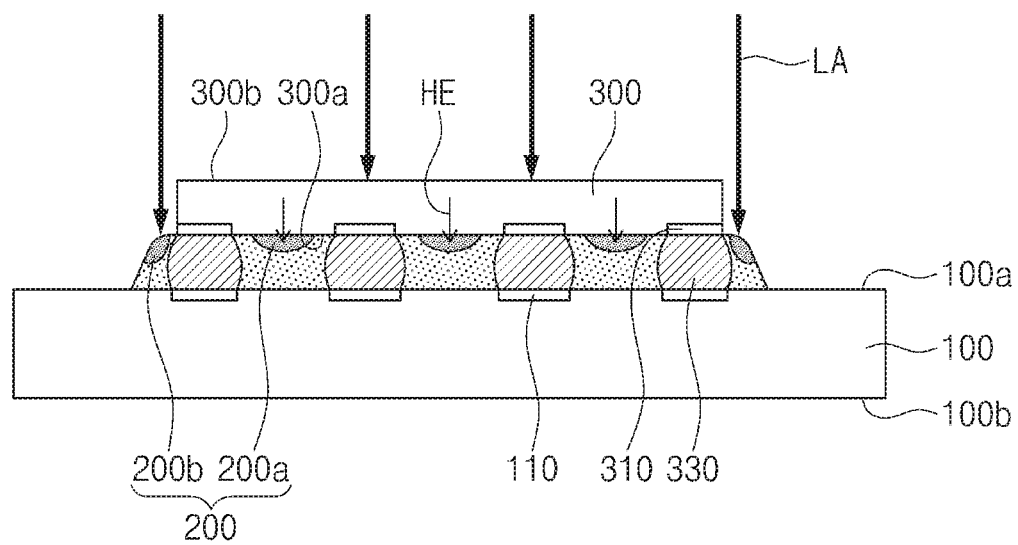

Referring to FIG. 11, the semiconductor chip 300 may be bonded on the substrate 100. For example, a laser irradiation process may be performed on the substrate 100. Particularly, a laser LA may be irradiated on the second surface 300b of the semiconductor chip 300. The semiconductor chip 300 may be heated by the laser LA. Heat HE generated in the semiconductor chip 300 may be transferred to the first portion 200a of the bonding member 200. The first portion 200a of the bonding member 200 may be cured by absorbing the heat HE transferred from the semiconductor chip 300.

The second portion 200b of the bonding member 200 protruding from the semiconductor chip 300 may be heated by directly absorbing the laser LA. The second portion 200b may be cured by absorbing heat from the laser LA.

Figure 12:
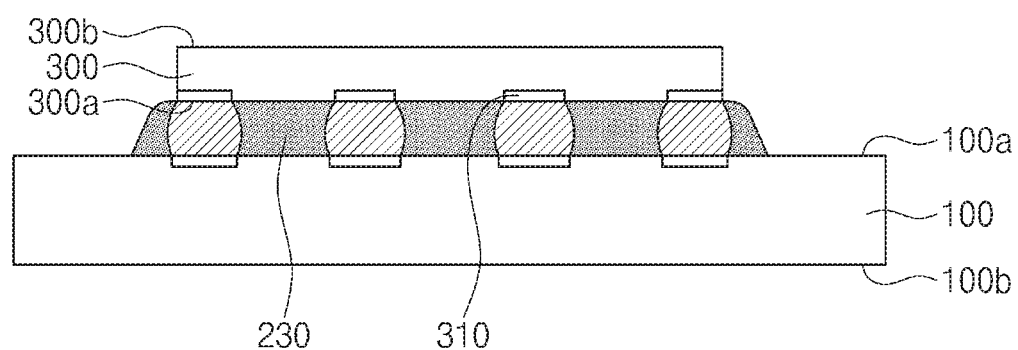

Referring to FIG. 12, the bonding member 200 may be cured to form an adhesive layer 230. The adhesive layer 230 may fix the semiconductor chip 300 on the top surface 100a of the substrate 100.

The semiconductor package may be formed as described above.

Experimental Example 1-1

The bonding member composite is prepared with a composition as below. The thermosetting resin may use bisphenol A type epoxy (DGEBA). The curing agent uses pyromellitic dianhydride (PDMA) and is added at a weight ratio of about 70% based on the thermosetting resin. The reducing agent uses phthalic acid and is added at a weight ratio of about 14.6% based on the thermosetting resin. The catalytic agent uses triethyl amine and is added at a weight ratio of about 0.4% based on the thermosetting resin. The laser absorbing agent uses disperse dyes and is added at a weight ratio of about 8% based on the thermosetting resin.

Experimental Example 1-2

The experimental example 1-2 is prepared as same as the experimental example 1-1, and the laser absorbing agent is added at a weight ratio of about 4% based on the thermosetting resin.

Experimental Example 1-3

The experimental example 1-3 is prepared as same as the experimental example 1-1, and the laser absorbing agent is added at a weight ratio of about 2% based on the thermosetting resin.

Experimental Example 1-4

The experimental example 1-4 is prepared as same as the experimental example 1-1, and the laser absorbing agent is added at a weight ratio of about 1% based on the thermosetting resin.

Comparative Example 1

The comparative example 1 is prepared as same as the experimental example 1-1, and the laser absorbing agent is not added.

Figure 13:
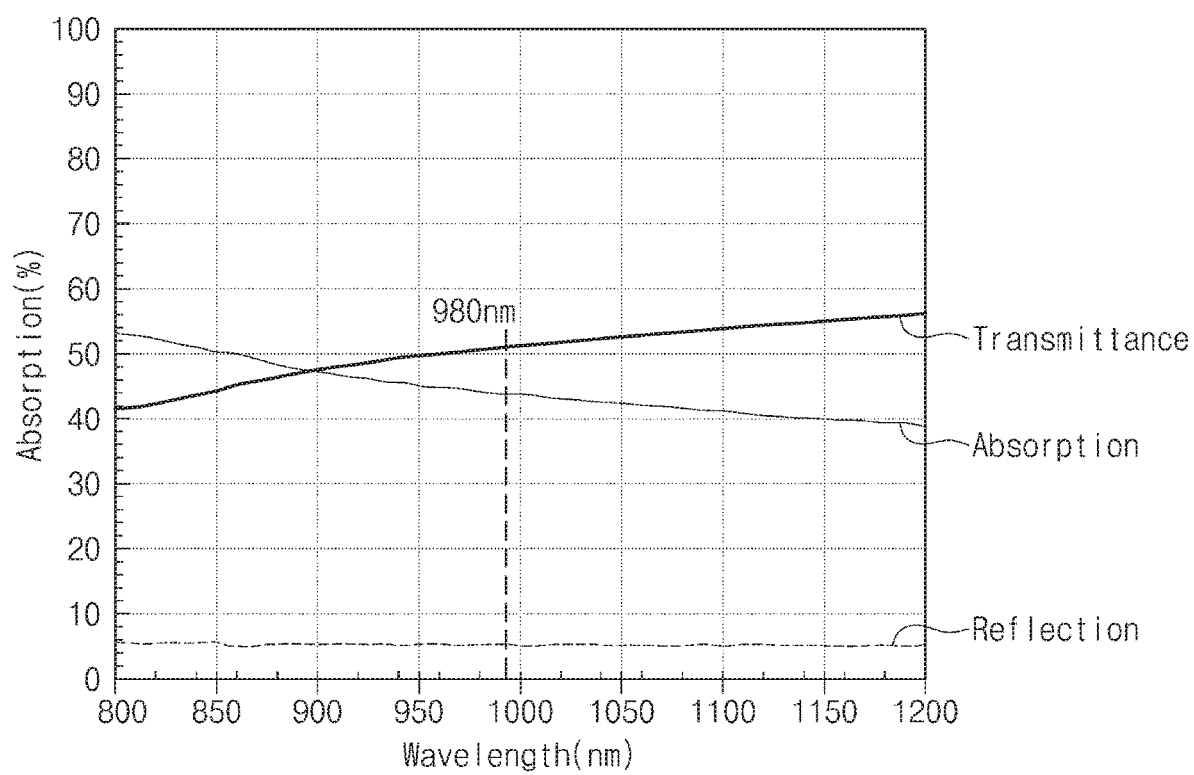
FIG. 13 is a graph representing a result obtained by measuring laser transmission, absorption, and reflection characteristics of an experimental example 1-1.

FIG. 13 is a graph representing a result obtained by measuring laser transmission, absorption, and reflection characteristics of the experimental example 1-1.

The bonding member composite having the composition of the experimental example 1-1 is applied with a thickness of about 50 μm on a glass substrate having a size of about 20 mm×20 mm, and then transmission, absorption, and reflection characteristics are measured by injecting a laser. As illustrated in FIG. 13, as a result of injecting the laser having a wavelength of about 980 nm, the experimental example 1-1 shows a transmittance of about 51%, a reflectance of about 5%, and an absorptance of about 44%. That is, it may be verified that a high absorptance is shown in a wavelength band of about 980 nm used in the laser process, and about 44% of the laser, which is directly irradiated to the bonding member composite, is converted into heat and used as a heat source of the semiconductor bonding process.

Figure 14:
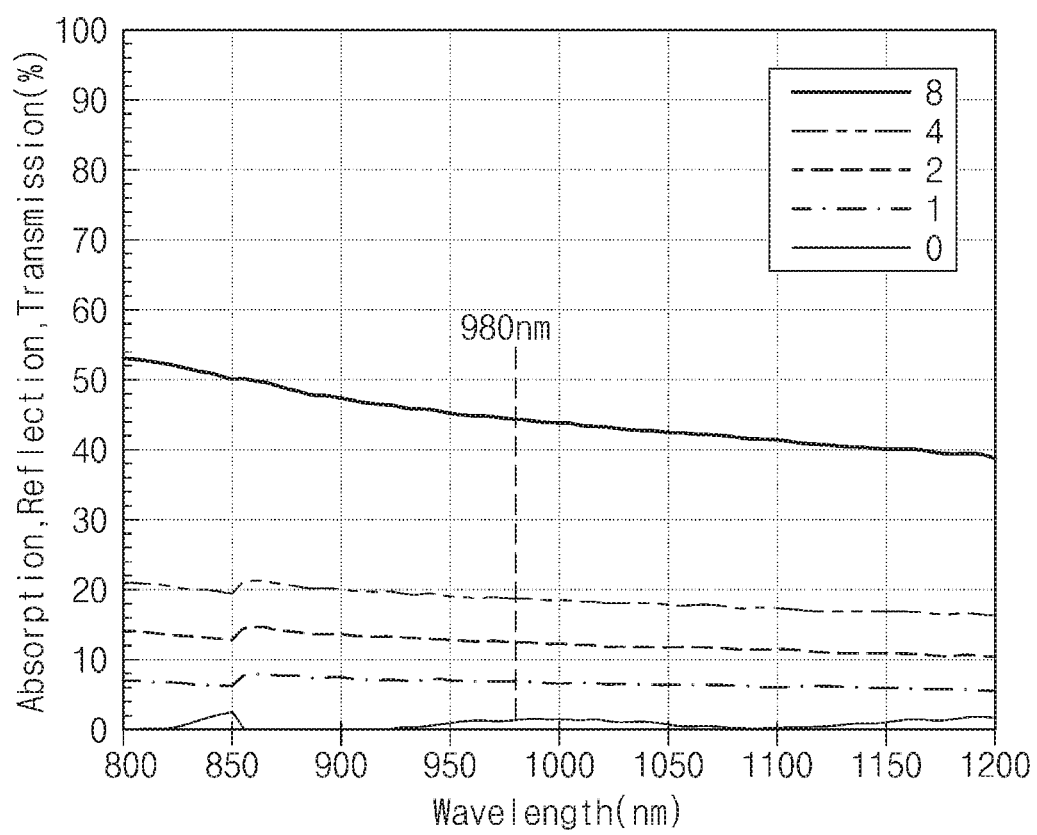
FIG. 14 is a graph representing a result obtained by measuring laser absorption characteristics of experimental examples and a comparative example.

FIG. 14 is a graph representing a result obtained by measuring laser absorption characteristics of the experimental examples and the comparative example 1.

The bonding member composite having the composition of the experimental examples and the comparative example 1 is applied with a thickness of about 50 μm on a glass substrate having a size of about 20 mm×20 mm, and then the absorption characteristics are measured by injecting a laser. As illustrated in FIG. 14, it may be verified that the experimental example 1-1, in which the laser absorbing agent is added, shows a high absorptance in the wavelength band of about 980 nm used in the laser process. Also, when the laser absorptances of the experimental examples 1-1 to 1-4 and the comparative example are compared, it may be verified that the laser absorptance increases as an added amount of the laser absorbing agent increases. In detail, each of the experimental example 1-1 and the experimental example 1-2, in which the laser absorbing agent has a weight of about 4% and about 8% of the weight of the thermosetting resin, has a high laser absorptance, and particularly, in case of the experimental example 1-1, the laser absorptance shows a high value of about 40% to about 50%. That is, it may be verified that the bonding member composite having the composition including the laser absorbing agent according to an embodiment of the inventive concept has the high laser absorptance, and the bonding member composite may be easily cured itself by the direct curing method in which the bonding member composite is cured by being directly heated by the irradiation of the laser.

That is, an added amount of the laser absorbing agent, which shows the laser absorption of about 20%, is equal to or greater than about 4% of the thermosetting resin, and an added amount of the laser absorbing agent, which shows degradation in bonding characteristics by a void, is equal to or less than about 10% of the thermosetting resin. That is, the laser absorbing agent may be added by about 4% to about 10% of the thermosetting resin in order to improve the efficiency of the bonding member composite including the dye-based laser absorbing agent. Most preferably, the laser absorbing agent may have a weight of about 4% to about 8% of the weight of the thermosetting resin.

Experimental Example 2-1

The bonding member composite is prepared with a composition as below. The thermosetting resin may use bisphenol A type epoxy (DGEBA). The curing agent uses pyromellitic dianhydride (PDMA) and is added at a weight ratio of about 70% based on the thermosetting resin. The reducing agent uses phthalic acid and is added at a weight ratio of about 14.6% based on the thermosetting resin. The catalytic agent uses triethyl amine and is added at a weight ratio of about 0.4% based on the thermosetting resin. The laser absorbing agent uses carbon black and is added at a weight ratio of about 1.0% based on the thermosetting resin.

Experimental Example 2-2

The experimental example 2-2 is prepared as same as the experimental example 2-1, and the laser absorbing agent is added at a weight ratio of about 0.8% based on the thermosetting resin.

Experimental Example 2-3

The experimental example 2-3 is prepared as same as the experimental example 2-1, and the laser absorbing agent is added at a weight ratio of about 0.6% based on the thermosetting resin.

Experimental Example 2-4

The experimental example 2-4 is prepared as same as the experimental example 2-1, and the laser absorbing agent is added at a weight ratio of about 0.4% based on the thermosetting resin.

Experimental Example 2-5

The experimental example 2-5 is prepared as same as the experimental example 2-1, and the laser absorbing agent is added at a weight ratio of about 0.2% based on the thermosetting resin.

Comparative Example 2

The comparative example 2 is prepared as same as the experimental example 2-1, and the laser absorbing agent is not added.

Figure 15:
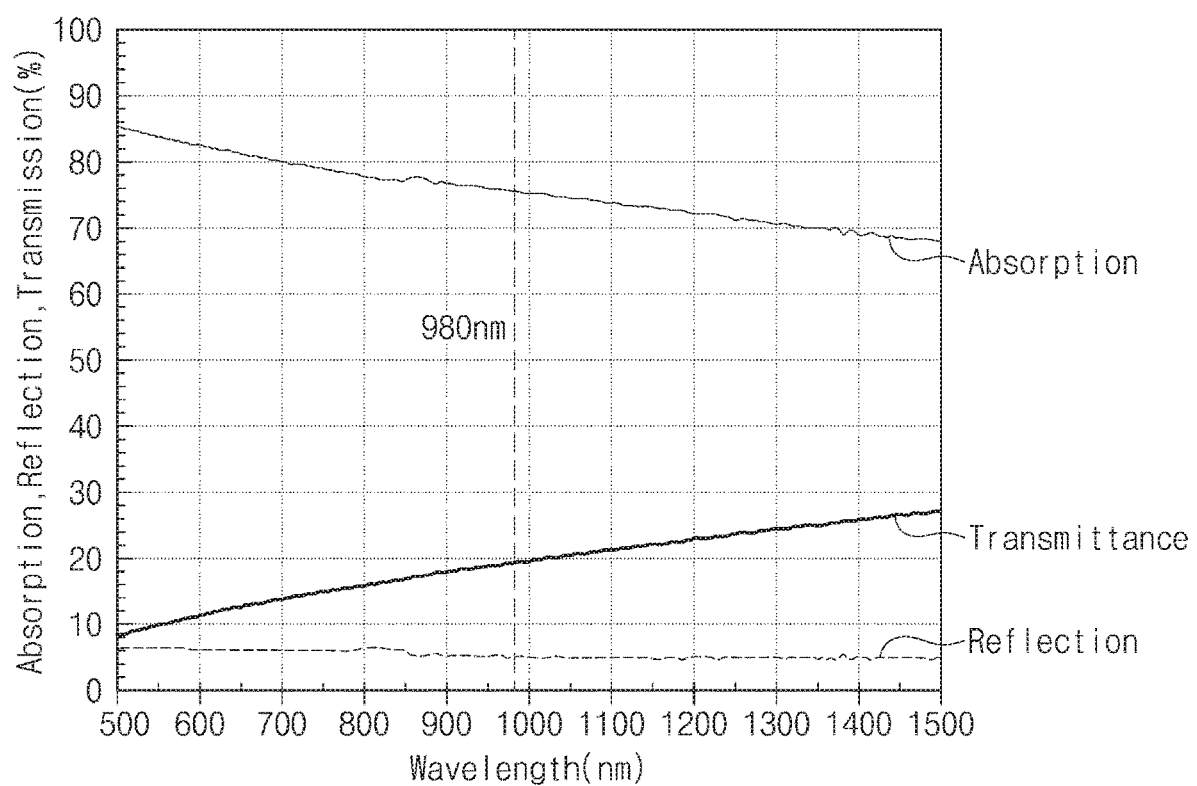
FIG. 15 is a graph representing a result obtained by measuring laser transmission, absorption, and reflection characteristics of an experimental example 2-1.

FIG. 15 is a graph representing a result obtained by measuring laser transmission, absorption, and reflection characteristics of the experimental example 1.

The bonding member composite having the composition of the experimental example 2-4 is applied with a thickness of about 50 μm on a glass substrate having a size of about 20 mm×20 mm, and then the transmission, absorption, and reflection characteristics are measured by injecting a laser. As illustrated in FIG. 15, as a result of injecting the laser having a wavelength of about 980 nm, the experimental example 2-4 shows a transmittance of about 19%, a reflectance of about 5%, and an absorptance of about 76%. That is, it may be verified that a high absorptance is shown in a wavelength band of about 980 nm used in the laser process, and about 76% of the laser, which is directly irradiated to the bonding member composite, is converted into heat and used as a heat source of the semiconductor bonding process.

Figure 16:
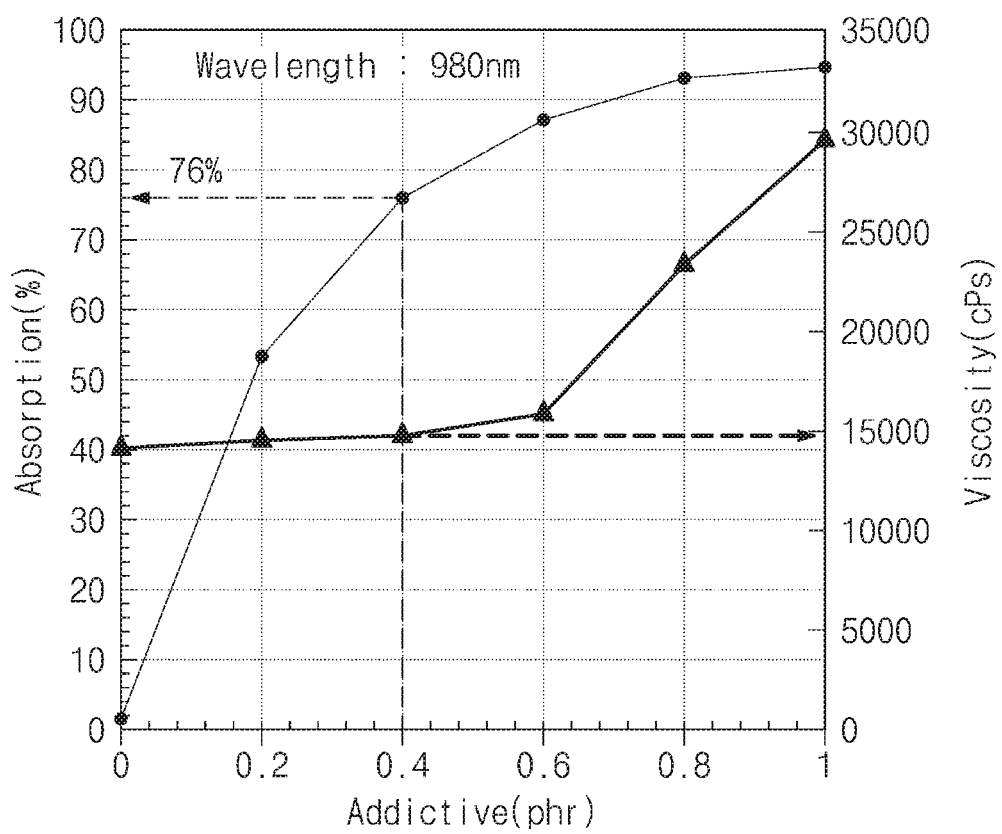
FIG. 16 is a graph representing a result obtained by measuring laser absorption characteristics of the experimental examples and the comparative example.

FIG. 16 is a graph representing a result obtained by measuring laser absorption characteristics and viscosity characteristics of the experimental examples and the comparative example 2.

The bonding member composite having the composition of the experimental examples and the comparative example 2 is applied with a thickness of about 50 μm on a glass substrate having a size of about 20 mm×20 mm, and then the absorption characteristics are measured by injecting a laser.

As illustrated in FIG. 16, the comparative example 2, in which the laser absorbing agent is not added, shows that the laser absorptance is close to about 0%, and the experimental example 2-5, in which the laser absorbing agent is added at a weight ratio of about 0.2% based on the thermosetting resin, shows the laser absorptance greater than about 50% Particularly, it may be measured that the laser absorptance increases as an addition rate of the laser absorbing agent increases, and it may be verified that the experimental example 2-1, in which the laser absorbing agent is added at a weight ratio of about 1.0% based on the thermosetting resin, shows the extremely high laser absorptance greater than about 90%.

In case of a viscosity of the bonding member composite, each of the comparative example 2, the experimental example 2-5, the experimental example 2-4, and the experimental example 2-3 shows a viscosity of about 15000 cPs. When the laser absorbing agent is added at a weight ratio of about 0.8% or more based on the thermosetting resin, as an addition rate of the laser absorbing agent increases, the viscosity of the composite rapidly increases. Particularly, the experimental example 2-1, in which the laser absorbing agent is added at a weight ratio of about 1.0% based on the thermosetting resin, shows the viscosity of about 30000 cPs.

That is, an added amount of the laser absorbing agent, which shows the laser absorption of about 40%, is equal to or greater than about 0.8% of the thermosetting resin, and an added amount of the laser absorbing agent, which shows the viscosity equal to or less than about 17000 cPs, is equal to or less than about 0.6% of the thermosetting resin. That is, the laser absorbing agent may be added by about 0.2% to about 0.6% of the thermosetting resin in order to improve the efficiency of the bonding member composite including the carbon black-based laser absorbing agent.

In the bonding member composite and the method for manufacturing the semiconductor package using the same according to the embodiment of the inventive concept, the bonding member composite may be cured in the indirect curing method, in which the bonding member composite is cured by receiving heat from the substrate, the element, or the chip disposed therearound and heated by the irradiation of the laser, and in the direct curing method, in which the bonding member composite is directly heated and cured itself by the irradiation of the laser. Thus, the efficiency of the curing process of the bonding member composite may improve, and the substrate, the element, or the chip may be prevented from being damaged caused by the short process time (i.e., the irradiation time of the laser).

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A method for manufacturing a semiconductor package, the method comprising:
   providing a semiconductor chip on a substrate;
   providing a bonding member between the substrate and the semiconductor chip; and
   bonding the semiconductor chip on the substrate by irradiating of a laser on the substrate,
   wherein the bonding member comprises a thermosetting resin, a curing agent, and a laser absorbing agent, and
   wherein the bonding of the semiconductor chip comprises:
      a first process of irradiating of the laser on a portion of the bonding member, the portion of the bonding member being exposed to one side of the semiconductor chip; and
      a second process of irradiating of the laser on the semiconductor chip, wherein the laser absorbing agent absorbs the laser to heat the bonding member during the first process, and
   wherein, during the second process, the semiconductor chip is heated by the laser, and the bonding member receives heat from the semiconductor chip.

2. The method of claim 1, wherein the bonding member further comprises a solder material, and
   the bonding member is provided between a substrate pad of the substrate and a chip pad of the semiconductor chip.

3. The method of claim 2, wherein the bonding member forms a first connection terminal configured to connect the substrate pad and the chip pad by the irradiating of the laser.

4. The method of claim 1, further comprising mounting the semiconductor chip on the substrate before the providing of the bonding member between the substrate and the semiconductor chip,
   wherein the semiconductor chip is mounted to the substrate by using a second connection terminal, and
   the bonding member fills a remain space between the substrate and the semiconductor chip.

5. The method of claim 4, wherein the second connection terminal comprises a solder ball provided between a substrate pad of the substrate and a chip pad of the semiconductor chip or a bonding wire extending from a top surface of the semiconductor chip to the substrate pad of the substrate.

6. The method of claim 1, wherein the laser absorbing agent comprises dyes such as acid dyes, natural dyes, basic dyes, cationic dyes, synthetic dyes, direct dyes, substantive dyes, disperse dyes, sulfur dyes, pigment dyes, mordant dyes, vat dyes, reactive dyes, macromolecular dyes, metallized dyes, naphthol dyes, premetallized dyes, gel dyeing, developed dyes, azo dyes, aniline dyes, or anthraquinone dyes.

7. The method of claim 6, wherein the laser absorbing agent has a weight of about 4% to about 8% of a weight of the thermosetting resin.

8. The method of claim 1, wherein the laser absorbing agent comprises a rubber carbon material such as rubber carbon black, N234 carbon black, N326 carbon black, N339 carbon black, and SAF (super abrasion furnace) grade 762 carbon black, or an electrical conductive carbon black.

9. The method of claim 8, wherein the laser absorbing agent has a weight of about 0.2% to about 0.6% of a weight of the thermosetting resin.

10. The method of claim 1, wherein an irradiation time of the laser is in a range from about one second to about ten seconds.

11. The method of claim 1, wherein the bonding member further comprises a reducing agent.

12. A method for manufacturing a semiconductor package, the method comprising:
providing a bonding member on a chip pad of a semiconductor chip;
disposing the semiconductor chip on a substrate so that the bonding member contacts a substrate pad of the substrate; and
forming a connection terminal by irradiating of a laser to the bonding member,
wherein the bonding member comprises a solder material and a laser absorbing agent, and
wherein a first portion of the bonding member protrudes to one side of the semiconductor chip, and the first portion of the bonding member is directly irradiated by the laser to form the connection terminal, the laser absorbing agent of a first portion absorbs the laser to heat the bonding member,
wherein a second portion of the bonding member providing between the substrate and the semiconductor chip receives heat from the semiconductor chip heated by the laser to form the connection terminal.

13. The method of claim 12, wherein an irradiation time of the laser is in a range from about one second to about ten seconds.

14. The method of claim 12, wherein the bonding member comprises a thermosetting resin and a curing agent, and the bonding member is cured during the irradiating of the laser.

15. The method of claim 12, wherein the laser absorbing agent comprises dyes such as acid dyes, natural dyes, basic dyes, cationic dyes, synthetic dyes, direct dyes, substantive dyes, disperse dyes, sulfur dyes, pigment dyes, mordant dyes, vat dyes, reactive dyes, macromolecular dyes, metallized dyes, naphthol dyes, premetallized dyes, gel dyeing, developed dyes, azo dyes, aniline dyes, and anthraquinone dyes, a rubber carbon material such as rubber carbon black, N234 carbon black, N326 carbon black, N339 carbon black, SAF (super abrasion furnace) grade 762 carbon black, or an electrical conductive carbon black.

* * * * *